United States Patent
Zibold et al.

(10) Patent No.: US 9,429,672 B2
(45) Date of Patent: Aug. 30, 2016

(54) LOCATOR

(75) Inventors: Tobias Zibold, Stuttgart (DE); Andrej Albrecht, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 87 days.

(21) Appl. No.: 14/234,701

(22) PCT Filed: Jun. 19, 2012

(86) PCT No.: PCT/EP2012/061732
§ 371 (c)(1),
(2), (4) Date: May 6, 2014

(87) PCT Pub. No.: WO2013/013896
PCT Pub. Date: Jan. 31, 2013

(65) Prior Publication Data
US 2014/0239981 A1    Aug. 28, 2014

(30) Foreign Application Priority Data
Jul. 25, 2011    (DE) .......................... 10 2011 079 704

(51) Int. Cl.
*G01R 27/26* (2006.01)
*G01V 3/02* (2006.01)
*G01V 3/08* (2006.01)
*G01V 3/15* (2006.01)

(52) U.S. Cl.
CPC .............. *G01V 3/02* (2013.01); *G01R 27/2605* (2013.01); *G01V 3/088* (2013.01); *G01V 3/15* (2013.01)

(58) Field of Classification Search
CPC .................................................. G01R 27/2605
USPC ............................ 324/658–690; 345/173–174
See application file for complete search history.

(56) References Cited

U.S. PATENT DOCUMENTS 3,826,979 A    7/1974    Steinmann
4,099,118 A    7/1978    Franklin et al.
(Continued)

FOREIGN PATENT DOCUMENTS

DE    20 2006 009 188 U1    11/2007
DE    10 2007 058 088 A1    6/2009
(Continued)

OTHER PUBLICATIONS

International Search Report corresponding to PCT Application No. PCT/EP2012/061732, mailed Jun. 5, 2013 (German and English language document) (6 pages).

*Primary Examiner* — Patrick Assouad
*Assistant Examiner* — Demetrius Pretlow
(74) *Attorney, Agent, or Firm* — Maginot, Moore & Beck LLP (57) ABSTRACT

A locator for capacitively sensing an object includes a transmission electrode to which an excitation signal can be applied, a reception electrode, a sensing region in the region of the transmission electrode and the reception electrode, and a measuring device for sensing a capacitance between the transmission electrode and the reception electrode. The locator further includes a processing device for determining the presence of the object in the sensing region if the sensed capacitance differs from a reference capacitance, and a screening electrode that is arranged in the region of the transmission electrode and the reception electrode. The screening electrode is connected to a potential so as to reduce the base capacitance between the transmission electrode and the reception electrode.

10 Claims, 5 Drawing Sheets

(56) References Cited

U.S. PATENT DOCUMENTS

| | | | | |
|---|---|---|---|---|
| 4,420,754 | A | * | 12/1983 | Andermo ................. 324/660 |
| 4,853,617 | A | * | 8/1989 | Douglas et al. ............ 324/67 |
| 5,651,044 | A | * | 7/1997 | Klotz et al. ................ 378/117 |
| 5,861,754 | A | * | 1/1999 | Ueno et al. ................ 324/660 |
| 5,973,318 | A | | 10/1999 | Plesko |
| 6,249,130 | B1 | | 6/2001 | Greer |
| 7,994,793 | B2 | * | 8/2011 | Matsumoto et al. ......... 324/457 |
| 2002/0080014 | A1 | * | 6/2002 | McCarthy et al. ........... 340/426 |
| 2005/0092108 | A1 | * | 5/2005 | Andermo ................. 73/862.626 |
| 2008/0303517 | A1 | * | 12/2008 | Skultety-Betz et al. ...... 324/234 |
| 2009/0009485 | A1 | * | 1/2009 | Bytheway ............... G06F 3/044 345/174 |
| 2009/0212849 | A1 | * | 8/2009 | Reime ...................... 327/517 |
| 2011/0175671 | A1 | * | 7/2011 | Reynolds ............. H03K 17/962 327/517 |

FOREIGN PATENT DOCUMENTS

| | | |
|---|---|---|
| DE | 10 2008 005 783 A1 | 7/2009 |
| DE | 20 2009 017 337 U1 | 5/2010 |
| DE | 10 2008 054 445 A1 | 6/2010 |
| DE | 10 2008 054 460 A1 | 6/2010 |
| DE | 10 2009 057 439 A1 | 5/2011 |
| EP | 0 753 438 A1 | 1/1997 |
| WO | 2006/025003 A1 | 3/2006 |

* cited by examiner

LOCATOR

This application is a 35 U.S.C. §371 National Stage Application of PCT/EP2012/061732, filed on Jun. 19, 2012, which claims the benefit of priority to Serial No. DE 10 2011 079 704.1, filed on Jul. 25, 2011 in Germany, the disclosures of which are incorporated herein by reference in their entirety.

BACKGROUND

The present disclosure relates to a locator. In particular, the present disclosure relates to a locator for a dielectric or metallic object using a capacitive coupling.

For locating an object concealed in a wall of a building, for example, a wooden beam, a steel reinforcement, a water or gas line, or a power cable, various so-called stud detectors are known, which detect the aforementioned objects based on their influence on an electric field.

DE 10 2008 054 445 A1 discloses a stud finder that includes a two-dimensional arrangement of multiple electrodes for providing various sensor signals.

DE 10 2008 054 460 A1 discloses a similar stud finder having a matrix-like arrangement of a plurality of sensor elements.

DE 10 2007 058 088 A1 discloses yet another stud finder and a geometrical arrangement of a transmitting electrode system relative to a receiving electrode system.

Other stud finders are presented in U.S. Pat. No. 4,099,118 and DE 20 2009 017 337.

Known stud finders generally function using a transmitting electrode and a receiving electrode, an excitation signal acting upon the transmitting electrode, and a capacitance between the transmitting electrode and the receiving electrode then being determined. If a dielectric or metallic object approaches the arrangement of the transmitting electrode and the receiving electrode, the determined capacitance changes, so that the object may be detected.

The object of the present disclosure is to specify a locator having an arrangement of electrodes that enables a more sensitive and more selective determination of the object.

SUMMARY

The present disclosure achieves this object using a locator having the features of the disclosure. Subclaims disclose preferred specific embodiments.

A locator according to the present disclosure for the capacitive detection of an object comprises a transmitting electrode for being acted upon by an excitation signal, a receiving electrode, a detection area in the area of the transmitting electrode and the receiving electrode, a measuring device for detecting a capacitance between the transmitting electrode and the receiving electrode, a processing device for determining the presence of the object in the detection area if the detected capacitance differs from a reference capacitance, and a shielding electrode that is arranged in the area of the transmitting electrode and the receiving electrode and is connected to a potential, in order to reduce the basic capacitance between the transmitting electrode and the receiving electrode.

In contrast to the related art, an additional shielding electrode is used in the locator according to the present disclosure. This shielding electrode reduces the intended capacitive coupling between the transmitting electrode and the receiving electrode in an area close to the sensor without essentially influencing the capacitive coupling in the detection area of the sensor.

The shielding electrode thus differs from both a guard electrode, which shields the non-homogeneous edge region of the electric field of a capacitive sensor from the measuring electrode, thus ensuring a homogeneous field up to the edge of the sensor surface, and from a shield electrode, by which parasitic capacitive couplings are eliminated.

The transmitting electrode, the receiving electrode, and the shielding electrode are preferably arranged in a plane. The shielding electrode is preferably is provided between the other two electrodes. Generally, the shielding electrode is preferably to be placed in such a way relative to the transmitting and receiving electrodes that the portion of the electric field of the transmitting electrode that does not run through a detection area of the locator is established to the greatest possible extent between the transmitting electrode and the shielding electrode, instead of between the transmitting electrode and the receiving electrode. This is what is meant when it is subsequently stated in particular that the shielding electrode is situated in the area of the transmitting electrode and the receiving electrode.

The dynamics of a capacitive measuring system are in principle limited by a ratio of the change in capacitance under the influence or without the influence of the object, to a basic capacitance between the transmitting electrode and the receiving electrode without the influence of objects. This ratio directly influences the signal-to-noise ratio or SNR. By reducing the basic capacitance according to the present disclosure, the specified ratio is increased, thereby making possible a direct improvement of the signal-to-noise ratio. As a result, a sensitivity, a detection distance, and/or a selectivity may be improved when detecting the object.

In one preferred specific embodiment, the shielding electrode is arranged and connected to the potential in such a way that a difference in the capacitances between the transmitting electrode and the receiving electrode caused by the object is minimized, ideally being unchanged. It is thus possible to reduce parasitic capacitances without reducing the desired difference in capacitance that is used for identifying the object.

The detection area also advantageously lies outside an area of influence of the object on the capacitance between the transmitting electrode and the shielding electrode. It is thus possible to achieve the goal of reducing only the basic capacitance while the difference in the capacitances caused by the object simultaneously remains the same. The exact arrangement of the shielding electrode relative to the transmitting electrode or receiving electrode may thus be a function of the position of the detection area. As a result, it may be possible to choose the shape and size of the shielding electrode as a function of a predetermined detection area such that the described improvement of the ratio of the change in capacitance and the basic capacitance is optimized.

In one preferred specific embodiment, the transmitting electrode, the receiving electrode, and the shielding electrode are arranged in a plane. This arrangement may be advantageous in particular for detecting an object that is concealed in a building wall. A sensitivity of such a planar sensor arrangement with respect to tilting relative to the wall may be minimized. The transmitting electrode, the shielding electrode, and the receiving electrode are also preferably arranged radially symmetrically. As a result, independence of a determination result from a position of the object relative to the electrode arrangement may be achievable.

In another preferred specific embodiment, a second shielding electrode may be provided, which surrounds the other electrodes or is situated radially outside the other electrodes.

As a result, a sensitivity of the sensor arrangement toward its edge may be reduced, so that it is possible to limit the detection area more sharply. The second shielding electrode may be connected to the same potential as the first shielding electrode, or to a different potential.

In order to limit the detection area, a shielding electrode may attached to a side of the transmitting electrode, the receiving electrode, and the shielding electrode facing away from the detection area.

In a particularly preferred specific embodiment, the measuring device comprises a push-pull measurement bridge. The push-pull measurement bridge may include two transmitting electrodes and one receiving electrodes, with each of the transmitting electrodes, including the receiving electrode, forming one of the arrangements described above. In one alternative specific embodiment, two receiving electrodes may also be provided, in which each of the transmitting electrodes, each including one of the receiving electrodes, forms one of the arrangements described above. In one preferred specific embodiment, the two receiving electrodes may be interconnected with low impedance. In another specific embodiment, the two receiving electrodes may also be connected with high impedance, for example, separated by impedance transformers. In yet another alternative specific embodiment, only one transmitting electrode may also be provided, and the capacitance between the transmitting electrode and the receiving electrode in comparison to a reference capacitance may be determined, which, for example, may be formed via a compensation network at the push-pull measurement bridge.

In the case of the push-pull measurement bridge, the shielding electrode is preferably connected to a potential that essentially corresponds to that of the receiving electrode. In an alternative specific embodiment, a low-impedance amplifier may also be used instead of the push-pull measurement bridge.

In yet another alternative specific embodiment, a high-impedance amplifier may also be used instead of the push-pull measurement bridge, the shielding electrode preferably being connected to a potential that essentially corresponds to that of the transmitting electrode.

BRIEF DESCRIPTION OF THE DRAWING

The present disclosure will now be described in detail with reference to the accompanying figures.

DETAILED DESCRIPTION

Figure 1:
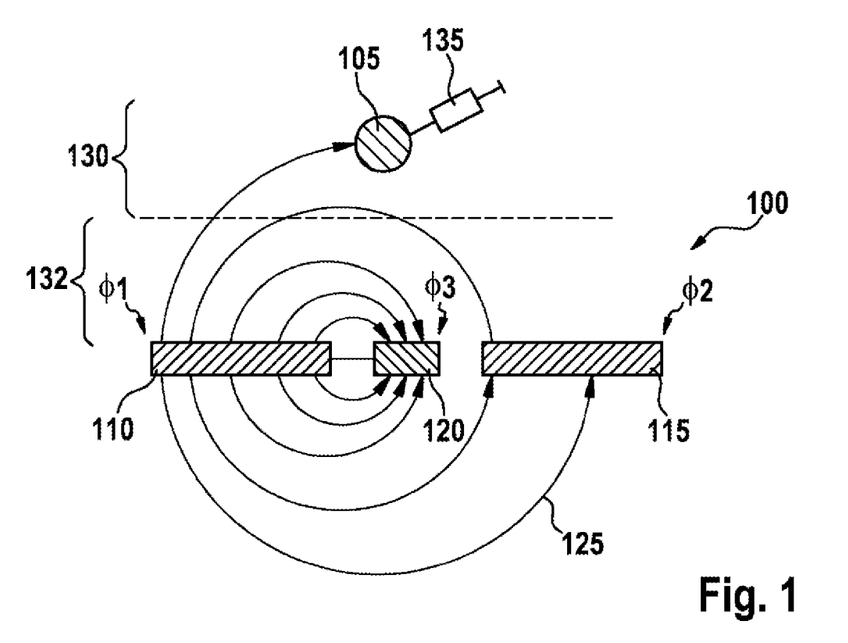
FIG. 1 shows an arrangement of a transmitting electrode and a receiving electrode including a shielding electrode.

FIG. 1 shows a longitudinal sectional view through an electrode arrangement 100 at an object 105. The electrode arrangement 100 includes a transmitting electrode 110, a receiving electrode 115, and a shielding electrode 120. In the non-visible dimension, the electrodes 110 to 120 are designed, for example, rectangularly having a constant thickness, other configurations also being conceivable. The transmitting electrode 110 is connected to a potential $\Phi 1$, the receiving electrode 15 is connected to a potential $\Phi 2$, and the shielding electrode 120 is connected to a potential $\Phi 3$. In other specific embodiments, the electrodes 110 to 115 do not have to be arranged in a plane. For example, the shielding electrode may extend vertically further upwards in the direction of the detection area 130.

Field lines 125 are shown between the electrodes 110 to 120, which arise from an electric field that exists between the ends of the field lines 125. The indicated direction of the field lines 125 is purely exemplary. The field lines 125 run such that, at each point of a field line 125, the direction of the electrostatic force is specified by a tangent to the field line into the point. The electric potential at this point is determined by the difference in potential between the start point and the end point of the field line 125 and the ratio of the lengths of the field line 125 to the start point and the end point.

The object 105 is located in a detection area 130. The detection area is only depicted above the electrodes 110 to 120. A detection area located symmetrically beneath the electrodes 110 to 120 is not discussed further here. In addition, an area 132 close to the sensor is defined between the electrodes 110 to 120 and the detection area 130. The shielding electrode 120 lies inside the area 132 close to the sensor, preferably horizontally between the transmitting electrode 110 and the receiving electrode 115.

Field lines 125, which run on the upper side of the electrode arrangement 100 from the transmitting electrode 110 to the receiving electrode 115, pass through the detection area 130. On the other hand, field lines 125 that start at the transmitting electrode 110 and remain within the area 132 close to the sensor, i.e., do not pass through the detection area 130, end at the shielding electrode 120. Thus, the portion of the electric field starting at the transmitting electrode 110 that cannot be influenced by the object 105 is guided to the shielding electrode 120, so that it does not contribute to a basic capacitance that exists between the transmitting electrode 110 and the receiving electrode 115.

The basic capacitance between the transmitting electrode 110 and the receiving electrode 115 is the capacitance that arises if the object 105 is not present in the detection area 130. However, if the object 105 is situated in the detection area 130, it is detected by a field line 125. Depending on whether or not the object 105 as shown in FIG. 1 is connected to reference potential or ground via a resistor 135, and depending on whether the object 105 has metallic or dielectric properties, the capacitance between the transmitting electrode 110 and the receiving electrode 115 may be decreased or increased relative to the basic capacitance by the presence of the object 105. The field line 125 that contacts the object 105 may end at the object 105 or continue to the receiving electrode 115.

In order to shape the field lines 125 in the described manner, the shielding electrode 120 must not only assume a suitable position relative to the transmitting electrode 110 and the receiving electrode 115, but must also be connected to a corresponding potential. This potential is among other things a function of the design of a measuring circuit by which the capacitance between the electrodes 110 and 115 is determined. In the illustrated case, the potential $\Phi 3$ of the shielding electrode 120 essentially corresponds to the potential $\Phi 2$ of the receiving electrode 115. This arrangement may advantageously be used in determining the capacitance via a low-impedance amplifier or a push-pull measurement bridge. If a high-impedance amplifier is used, the potential $\Phi 3$ may essentially correspond to the potential $\Phi 2$ of the receiving electrode 115. However, in this case, the potential $\Phi 3$ must be actively tracked to the potential $\Phi 2$. For this purpose, for example, the potential $\Phi 2$ at the receiving electrode 115 is detected with high impedance using an impedance transformer and applied to the shielding electrode 120 with low impedance.

Figure 2:
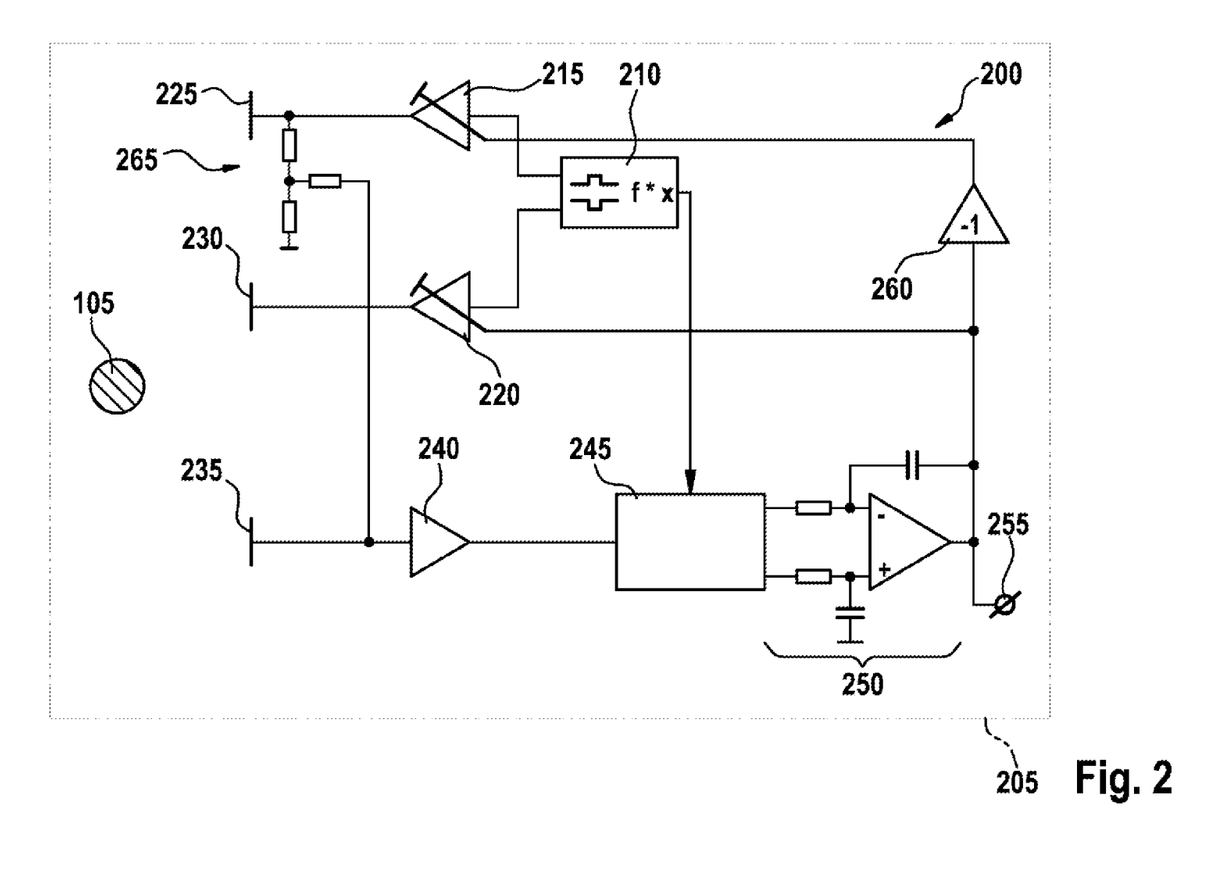
FIG. 2 shows a circuit diagram of a locator.

FIG. 2 shows a block diagram of a push-pull measurement bridge 200. The push-pull measurement bridge 200 is part of a locator 205 for detecting the object 105 in FIG. 1. The object 105 may in particular comprise a dielectric object 105, a grounded metallic object 105, or an ungrounded metallic object 105. In other specific embodiments of the locator 205, an electrode arrangement like that in FIG. 1 may also be connected to another measuring device, for example, an oscillating circuit or a sigma-delta modulator.

A clock generator 210 of the push-pull measurement bridge 200 has two outputs, at which it provides phase-shifted periodic alternating signals, preferably phase-shifted by 180°. The alternating signals may in particular include rectangular, triangular, or sinusoidal signals. The outputs of the clock generator are connected to a first controllable amplifier 215 or a second controllable amplifier 220. Each of the controllable amplifiers 215, 220 has a control input via which it accepts a signal that controls an amplification factor of the respective controllable amplifier 215, 220. An output of the first controllable amplifier 215 is connected to a first transmitting electrode 225, and an output of the second controllable amplifier 220 is connected to a second transmitting electrode 230. A receiving electrode 235 serves as a potential probe. The transmitting electrodes 225 and 230 correspond to the transmitting electrode 110 in FIG. 1, and the receiving electrode 235 corresponds to the receiving electrode 115 in FIG. 1.

The receiving electrode 235 is connected to an input amplifier 240. A compensation network 265 depicted in the region of the first receiving electrode 225 will not be examined at this stage. The input amplifier 240 is represented having a constant amplification factor; however, in other specific embodiments, an amplification factor of the input amplifier 240 may also be controllable. As a result, for example, a spatial resolution and/or sensitivity of the push-pull measurement bridge 200 may be influenceable and may, for example, be controllable as a function of a measurement signal at the input amplifier 240.

The output of the input amplifier 240 is connected to a synchronous demodulator 245. The synchronous demodulator 245 is furthermore connected to the clock generator 210 and receives a clock signal from it that references the phase position of the signals provided at the outputs of the clock generator 210. In a simple specific embodiment in which the signals provided by the clock generator 210 are symmetrical rectangular signals, one of the output signals fed to the controllable amplifiers 215, 220 may be used as a clock signal. The synchronous demodulator 245 connects the measurement signal received by the input amplifier 240 to its upper or lower output in an alternating manner essentially based on the clock signal provided by the clock generator 210.

Both outputs of the synchronous demodulator 245 are connected to an integrator (integrating comparator) 250, which is represented here as an operational amplifier connected to two resistors and two capacitors. Other specific embodiments are also possible, for example, in the form of an active low-pass filter. A digital design in connection with the synchronous demodulator 245 is also conceivable, in which the signal at the outputs of the synchronous demodulator 245 is converted from analog to digital at one or multiple points in time within one half-cycle and then compared to the corresponding value from a following or previous half-cycle. The difference is integrated and, for example, converted again to an analog signal and used for controlling the amplifiers 215, 220. While the synchronous demodulator 245 provides the measurement signal received from the input amplifier 240 at its lower output, the integrator 250 integrates this signal over time and provides the result at its output. While the synchronous demodulator 245 provides the measurement signal received from the input amplifier 240 at its upper output, this signal is inverted by the integrator 250 over time, and the result is provided at the output of the integrator 250. The voltage at the output of the integrator 250 is the integral of the difference of the low-pass-filtered outputs of the synchronous demodulator 245.

If the capacitance of the receiving electrode 235 relative to the first transmitting electrode 225 is exactly equal to the capacitance of the receiving electrode 235 relative to the second transmitting electrode 230, then the signals provided at the outputs of the synchronous demodulator 245 are equal on average over time, and a signal is provided at the output of the integrator 250 that approaches zero (reference potential). However, if the specified capacitances are not equal, for example, because the object 105 influences the capacitance between the receiving electrode 235 and the first transmitting electrode 225 differently than the capacitance between the receiving electrode 235 and the second transmitting electrode 230, then the signals provided at the outputs of the synchronous demodulator 245 are no longer equal on average over time, and a positive or negative signal is provided at the output of the integrator 250. The sign and magnitude of the signal indicate the ratio of the specified capacitances, a signal of zero corresponding to a ratio of the capacitances of one.

The signal provided by the integrator 250 is provided via a connection 255 to an evaluation and output device of the locator 205, which is not shown. The evaluation device may, for example, carry out a comparison with a threshold value, so that a user of the locator 205 receives a visual, audible, and/or haptic output if the signal provided by the integrator 250 exceeds a predetermined threshold. The entire signal or a magnitude of the signal may be compared to the threshold value.

The signal provided by the integrator 250 is also used for controlling the gains of the controllable amplifiers 215 and 220, the second controllable amplifier 220 being directly connected to the output of the integrator 250, and the first controllable amplifier 215 being connected to the output of the integrator 250 via an inverter 260. The inverter 260 causes an inversion of the signal provided to it in such a way that the gain of the first controllable amplifier 215 increases as a function of the output signal of the integrator 250 to the extent that the gain of the second controllable amplifier 220 decreases, or vice versa. It is also conceivable that only the gain of one of the controllable amplifiers 215, 220 is controlled, while the gain of the second controllable amplifier 220, 215 is held to a fixed value.

The gains of the controllable amplifiers 215 and 220 increase or decrease until an AC component, which is synchronous with the alternating voltage present at the transmitting electrodes 225 and 230 and is present at the receiving electrode, is minimized in magnitude.

The push-pull measurement bridge 200 is a control loop that is equipped to sustain a predetermined ratio of differences in potential at each of the transmitting electrodes 225 and 230 to the receiving electrode 235 by applying signals to the transmitting electrodes 223 and 230 at a suitable ratio.

The signal provided by the integrator 250 is a control signal for compensating for an asymmetrical influence of the variable capacitances on the differences in potential caused, for example, by the dielectric object. In other specific embodiments, the variable ratio at the electrodes is determined based on currents or voltages at the electrodes.

In another specific embodiment, the first transmitting electrode 225 is replaced by the compensation network 265. The compensation network 265 is made up of a voltage divider made of two impedances, whose output is coupled to the input of the input amplifier 240 via a third impedance. Thus, the alternating voltages of the controllable amplifiers 215, 220 are balanced out between the capacitance that exists between the at the second (and only) transmitting electrode 230 and the receiving electrode 235, and a reference capacitance formed by the compensation network 265. The reference capacitance is invariant relative to the dielectric object 105. Only the first transmitting electrode 225 and the receiving electrode 235 are required for the measurement.

Depending on the measuring method, the reference capacitance does not have to be implemented as a physical capacitance. It may also be a "virtual" reference capacitance. In one specific embodiment, for example, a time constant of a charging curve of a capacitor may be determined and compared to a reference time. This reference time is then a measure of the reference capacitance, without the reference capacitance being physically present in the push-pull measurement bridge 200.

Figure 3A:
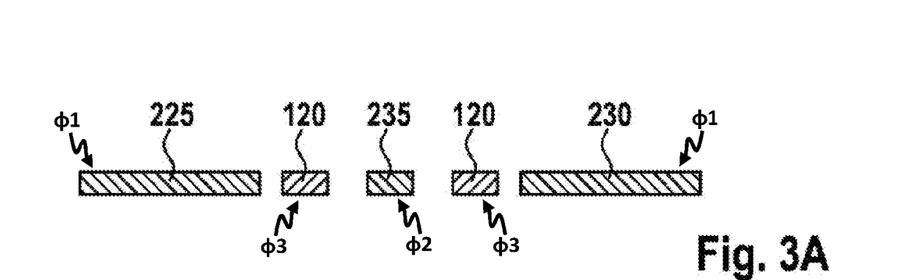
FIGS. 3 to 6 show additional arrangements of electrodes.
Figure 3B:
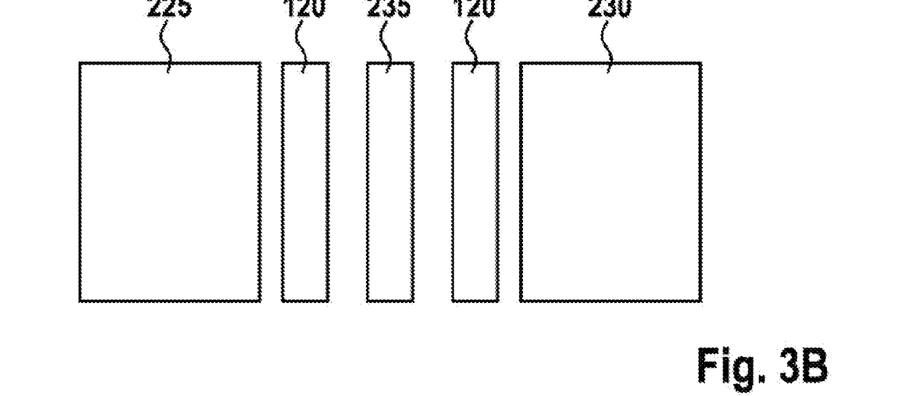

The arrangement of each of the transmitting electrodes 225, 230 relative to the receiving electrode is preferably provided with a shielding electrode 120, as described above in detail with reference to FIG. 1. FIG. 3 shows an arrangement of electrodes that is suitable for use with the push-pull measurement bridge 200 in FIG. 2. FIG. 3A shows a longitudinal sectional view, and FIG. 3B shows a top view.

The transmitting electrodes 225 and 230, the receiving electrode 235, and two shielding electrodes 120 are arranged in a plane. The shielding electrodes 120 are electrically interconnected and set to a potential Φ3, as described above in detail with reference to FIG. 1. The width and position of the shielding electrodes 120 in the intermediate spaces between the receiving electrode 235 and the transmitting electrodes 225 and 230 may be used to influence the amount by which the basic capacitance between the transmitting electrodes 225, 230 and the receiving electrode 235 is decreased.

As a result, the position and size of the detection area 130 (not illustrated) may simultaneously be influenced, as described above with reference to FIG. 1.

In one specific embodiment, a shield electrode is used, which extends parallel to the plane in which the electrodes 225 to 230 and 120 lie. The shield electrode is connected to a suitable potential, for example, reference potential or ground, and limits the detection area 130 to one side relative to the plane of the electrodes 225 to 235 and 120.

Based on the specific embodiments shown in FIG. 3, a number of variants is possible. For example, instead of being rectangular, the electrodes 225 to 235 and 120 may also be designed in any other shape, for example, rhomboid, triangular, elliptical, circular, or polygonal. It is also possible to break down the transmitting electrodes 225 and 230 and/or the receiving electrode 235 into multiple topologically disconnected areas that are, however, electrically interconnected. It is also possible to combine multiple transmitting electrodes 225, 230 with multiple receiving electrodes 235. The electrodes 225 to 235 and 120 do not necessarily have to be arranged in a plane, but may assume different distances from a plane or generally form any three-dimensional shape.

Figure 4A:
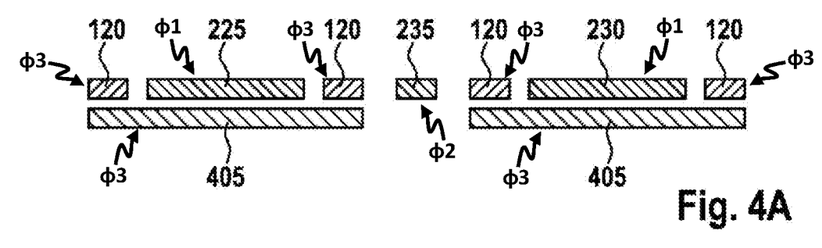
Figure 4B:
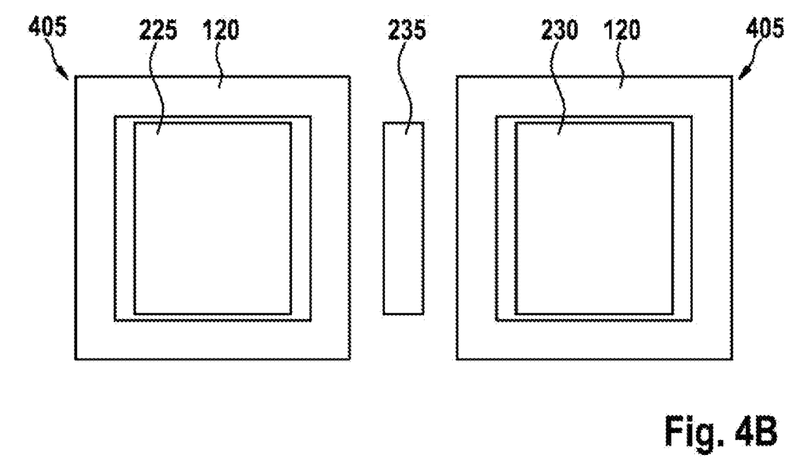

FIG. 4 shows another arrangement of electrodes, which is suitable for use at the push-pull measurement bridge 200 in FIG. 2. The views in FIGS. 4A and 4B correspond to those in FIGS. 3A and 3B.

Unlike the specific embodiment shown in FIG. 3, the shielding electrodes 120 surround the transmitting electrodes 225 and 230 in the plane of the transmitting electrodes 225, 230. All electrodes 225 to 235 and 120 are again situated in a plane. Two shield electrodes 405 are shown in a parallel plane, each having a surface that covers one of the transmitting electrodes 225, 230 and the associated shielding electrode 120. In the depicted specific embodiment, no shield electrode 405 exists in the area of the receiving electrode 235. However, in other specific embodiments, a shield electrode 405 may also be provided here. Only one shield electrode 405 may also be provided, which covers the surface of all electrodes 225 to 235 and 120.

The specific embodiment shown in FIG. 4 may be varied, as described above with reference to FIG. 3 with respect to the shape and arrangement of the electrodes 225 to 235 and 120.

Figure 5:
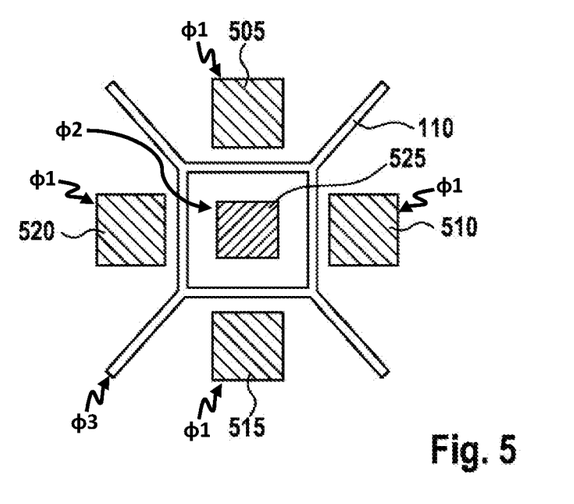

FIG. 5 shows an arrangement of electrodes that is rotationally symmetrical relative to an angle of rotation of 90°. Four transmitting electrodes 505, 510, 515, and 520 are arranged around a receiving electrode 525, each offset at equal distances by 90°. The shielding electrode 110 surrounds the receiving electrode 525 and also extends outwardly between adjacent transmitting electrodes 505 to 520. When using the push-pull measurement bridge 200 in FIG. 2, the transmitting electrodes 505 to 520 may be associated with the transmitting electrodes 225 to 230 in any manner. The receiving electrode 525 corresponds to the receiving electrode 235. A more complex measuring circuit may also be used, in which the four transmitting electrodes 505 to 520 are activated in four different phases.

The size, shape, and position of the electrodes 505 to 525 may be varied, as described above with reference to FIGS. 3 and 4. In addition, one or multiple shielding electrodes may be arranged on one side at a predetermined distance from the electrodes 505 to 525.

Figure 6:
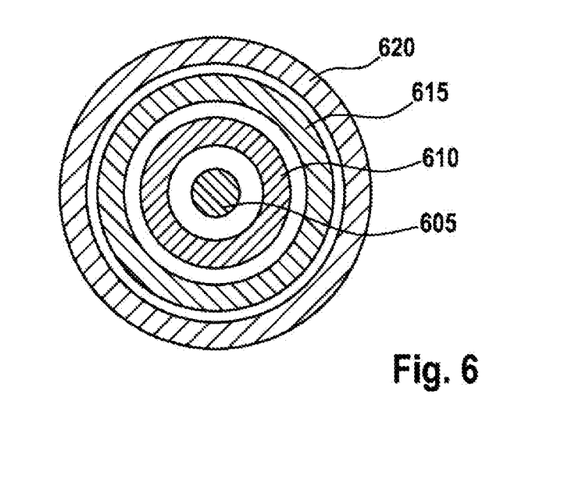

FIG. 6 shows another arrangement of electrodes, which is also suitable for use at the push-pull measurement bridge 200.

Four circular electrodes 605, 610, 615, and 620 are arranged concentrically in a plane. In one specific embodiment, the innermost electrode 605 corresponds to the receiving electrode 235, the next outer electrode 610 corresponds to the shielding electrode 620, and the in turn next outer electrode 615 corresponds to the transmitting electrode 230. In another specific embodiment, the arrangements of the electrodes 605 and 615 are exchanged. In both specific embodiments, the electrode 620 situated farther outside may optionally be provided as a second shielding electrode 120, which is connected to the same potential as, or to a potential other than that of, the shielding electrode 120 situated farther inside.

The electrodes 605 to 620 do not have to be situated in a plane and may also form any other closed curves other than circles. As already described above with reference to FIGS. 3 to 5, one or multiple shielding electrodes may also be used here on one side of the electrodes 605 to 620.

The invention claimed is:

1. A locator for the capacitive detection of an object, comprising:
   a first transmitting electrode configured to be acted upon by a first excitation signal;
   a second transmitting electrode configured to be acted upon by a second excitation signal;
   a receiving electrode arranged between the first transmitting electrode and the second transmitting electrode;
   a detection area near the first and second transmitting electrodes and the receiving electrode;
   a measuring device configured to detect a capacitance between the first and second transmitting electrodes and the receiving electrode;
   a processing device configured to determine the presence of the object in the detection area if the detected capacitance differs from a reference capacitance;
   a first shielding electrode arranged between the first transmitting electrode and the receiving electrode, the first shielding electrode being connected to a potential so as to reduce a basic capacitance between the first transmitting electrode and the receiving electrode, the basic capacitance between the first transmitting electrode and the receiving electrode being a capacitance while no object is present in the detection area;

a second shielding electrode arranged between the second transmitting electrode and the receiving electrode, the second shielding electrode being connected to the potential so as to reduce a basic capacitance between the second transmitting electrode and the receiving electrode, the basic capacitance between the second transmitting electrode and the receiving electrode being a capacitance while no object is present in the detection area; and a third shielding electrode arranged on a side of the first and second transmitting electrode, the receiving electrode, and the first and second shielding electrodes that faces away from the detection area, the third shielding electrode being connected to the potential so as to reduce at least one of (i) the basic capacitance between the first transmitting electrode and the receiving electrode and (ii) the basic capacitance between the second transmitting electrode and the receiving electrode.

2. The locator as claimed in claim 1, wherein:

the first shielding electrode is arranged and connected to the potential in such a way that a difference in a capacitance between the first transmitting electrode and the receiving electrode caused by the object being in present in the detection area is unchanged compared to without the first shielding electrode; and the second shielding electrode is arranged and connected to the potential in such a way that a difference in a capacitance between the second transmitting electrode and the receiving electrode caused by the object being in present in the detection area is unchanged compared to without the second shielding electrode.

3. The locator as claimed in claim 1, wherein the detection area lies outside an area of influence of the object on a capacitance between the first transmitting electrode and the first shielding electrode and on a capacitance between the second transmitting electrode and the second shielding electrode.

4. The locator as claimed in claim 1, wherein the first and second transmitting electrodes, the receiving electrode, and the first and second shielding electrodes are arranged in a plane.

5. The locator as claimed in claim 1, wherein the first and second transmitting electrodes, the first and second shielding electrodes, and the receiving electrode are arranged radially symmetrically.

6. The locator as claimed in claim 1, wherein the measuring device comprises a push-pull measurement bridge.

7. The locator as claimed in claim 6, wherein the push-pull measurement bridge is configured to determine the capacitance between the first and second transmitting electrodes and another receiving electrode.

8. The locator as claimed in claim 6, wherein at least one of the first shielding electrode and the second shielding electrode is connected to a potential that essentially corresponds to the potential of the receiving electrode.

9. The locator as claimed in claim 1, wherein the measuring device comprises a low-impedance amplifier connected to the receiving electrode, and at least one of the first shielding electrode and the second shielding electrode is connected to a potential that essentially corresponds to the potential of the receiving electrode.

10. The locator as claimed in claim 1, wherein the measuring device comprises a high-impedance amplifier connected to the receiving electrode, and at least one of the first shielding electrode and the second shielding electrode is connected to a potential that essentially corresponds to the potential of the receiving electrode.

* * * * *